(12) United States Patent
Roche et al.

(10) Patent No.: US 7,043,628 B2
(45) Date of Patent: May 9, 2006

(54) METHOD AND APPARATUS FOR PREVENTING A MICROPROCESSOR FROM ERRONEOUSLY ENTERING INTO A TEST MODE DURING INITIALIZATION

(75) Inventors: Franck Roche, Trets (FR); Pascal Narche, Peynier (FR); Ludovic Ruat, Greasque (FR)

(73) Assignee: STMicroelectronics SA, Montrouge (FR)

( * ) Notice: Subject to any disclaimer, the term of this patent is extended or adjusted under 35 U.S.C. 154(b) by 617 days.

(21) Appl. No.: 09/995,251

(22) Filed: Nov. 27, 2001

(65) Prior Publication Data

US 2002/0129234 A1    Sep. 12, 2002

(30) Foreign Application Priority Data

Nov. 28, 2000  (FR)  .................................. 00 15307

(51) Int. Cl.
*G06F 9/00* (2006.01)
(52) U.S. Cl. ............................................... 713/1; 713/2
(58) Field of Classification Search ................ 713/1, 713/2, 100; 714/738, 742
See application file for complete search history.

(56) References Cited

U.S. PATENT DOCUMENTS

| 5,103,167 | A | 4/1992 | Okano et al. ................ 324/158 |
| 6,408,415 | B1 * | 6/2002 | Kim ............................ 714/738 |
| 6,526,536 | B1 * | 2/2003 | Chen et al. .................. 714/738 |
| 6,605,956 | B1 * | 8/2003 | Farnworth et al. .......... 324/763 |

FOREIGN PATENT DOCUMENTS

DE       19855182       11/1999

* cited by examiner

*Primary Examiner*—Lynne H. Browne
*Assistant Examiner*—Paul Yanchus, III
(74) *Attorney, Agent, or Firm*—Lisa J. Jorgenson; Allen, Dyer, Doppelt, Milbrath & Gilchrist P.A.

(57) ABSTRACT

A microprocessor includes a counter having a counting input and a reset input. The counting input is coupled to a first terminal of the microprocessor for the selection of an operating mode thereof by application of a predetermined number of pulses to the first terminal. The reset input of the counter is driven by a control signal present on a second terminal of the microprocessor. The control signal is maintained by default at a first logic value ensuring the maintaining at zero of the counter during the initialization period by a circuit internal or external the microprocessor. Immunity against electromagnetic perturbations causing the microprocessor to enter into the test mode is provided.

49 Claims, 2 Drawing Sheets

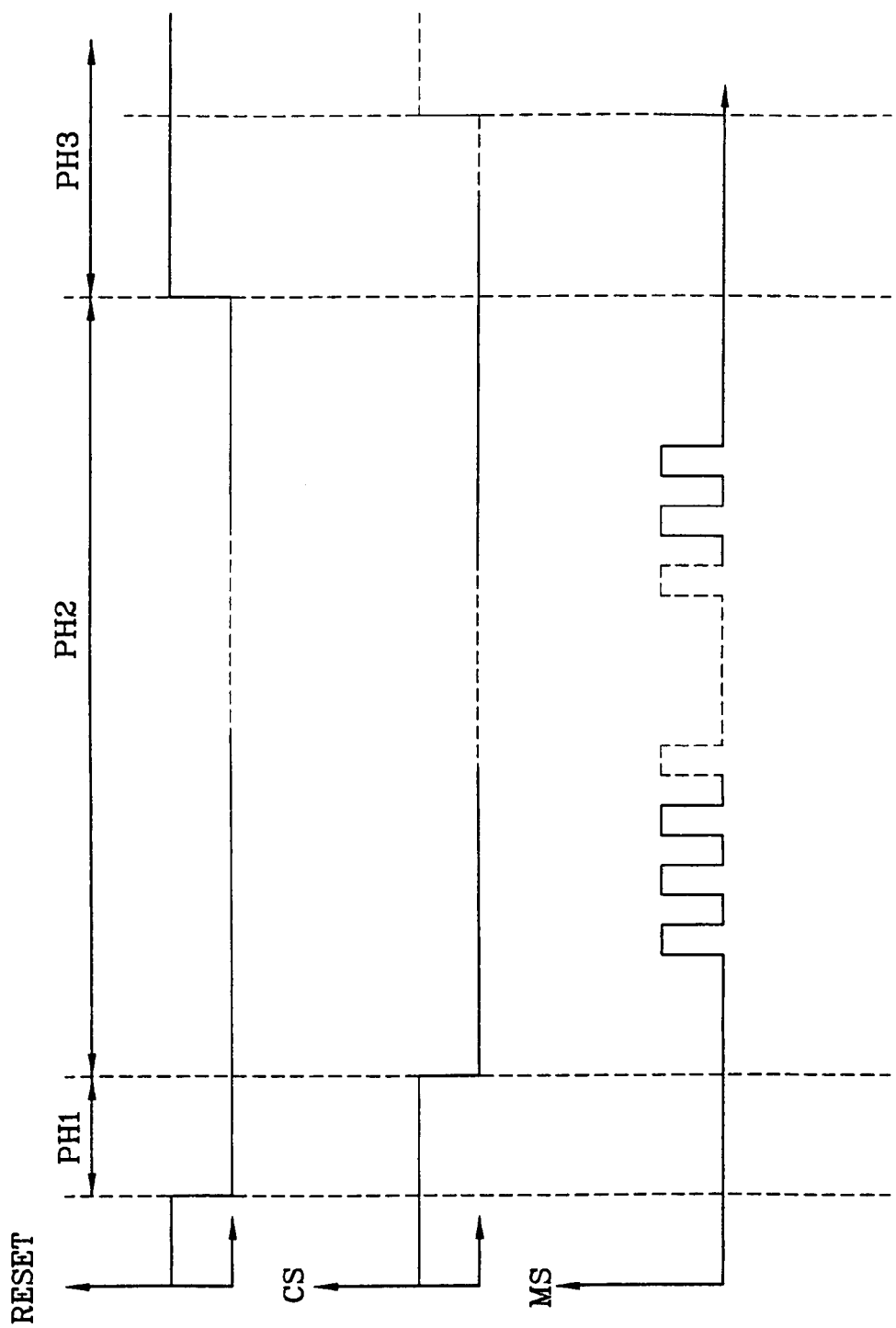

METHOD AND APPARATUS FOR PREVENTING A MICROPROCESSOR FROM ERRONEOUSLY ENTERING INTO A TEST MODE DURING INITIALIZATION

FIELD OF THE INVENTION

The present invention relates to microprocessors, and more particularly, to controlling the switching of a microprocessor into a predetermined operating mode.

BACKGROUND OF THE INVENTION

FIG. 1 schematically shows a microprocessor MP with a conventional device for switching the microprocessor into a predetermined operating mode. This device comprises a counter CNTR, the output of which is applied to the central processing unit CPU of the microprocessor by a decoder DEC. The counter CNTR has a counting input E1, a reset input E2 and an input E3 for validating and locking the output of the counter. Input E1 is coupled to a terminal P1 of the microprocessor, and inputs E2 and E3 receive the reset signal (RESET) of the microprocessor. By convention, the active value of the signal RESET is considered in the following as being the value 0. The counter CNTR is inhibited and maintained at zero when the signal RESET is at 1, and is active when the signal RESET has the active value 0.

As well known by those skilled in the art, the start of a microprocessor MP begins by an initialization sequence, the duration of which corresponds to a predetermined number of clock cycles, during which the signal RESET is set to 0 (active value). The temporary setting to 0 of the signal RESET has the effect of activating the counter CNTR so that a mode selection signal MS, formed by a series of pulses, can be applied to the counting input E1 by terminal P1. When the signal RESET switches again to 1, the rising edge of this signal on the input E3 of the counter activates output latches of the counter (not shown) so that the counter delivers a number N representative of the number of pulses applied to its input E1 when the signal RESET was at 0.

The number N is received by the input of decoder DEC, which then delivers two mode bits M0 and M1 to the central processing unit CPU of the microprocessor. Only one of these two bits is at a 1 according to the value of N. Bit M1 is, for example, equal to 1 when N is between values N1 and N2, and bit M0 is at 1 when N is not between these two values N1 and N2, which thus defines a selection window for mode M1.

Mode M0 (bit M0 at 1) or a default mode of the microprocessor is generally the user mode, i.e., the normal operating mode of the microprocessor in the application for which it has been programmed. Thus, when no pulse is applied to terminal P1 during the initialization period, the microprocessor always starts in the user mode, which means that it will read the first instruction of an application program arranged in its main program memory, such as a FLASH memory (not shown), for example.

Mode M1 (bit M1 at 1) is generally a test or servicing mode, where the program counter PC of the CPU unit is directed to a predetermined address corresponding to the first instruction of a test program. Such a test program is generally provided by the manufacturer and is prerecorded in a specific memory, such as a ROM memory, for example. This test program may also be a program for loading a test program in a memory for a greater test mode flexibility.

The test mode is reserved to the servicing or the testing of the microprocessor before its first power-on. When the microprocessor is arranged on a printed circuit board and is connected to various peripheral elements, the user must never apply a series of pulses to terminal P1 during the initialization period. Thus, for switching the microprocessor into the test mode, it is generally necessary to access terminal P1 by external equipment, such as conductive tongs for example, in order to apply the pulses of a mode MS selection signal.

It is essential that the microprocessor is not going to switch involuntarily into the test mode, wherein the microprocessor would not run the application program and would not operate as it should. An involuntary start in the test mode would lead to problems in a system controlled by the microprocessor, some of which may be serious. To that effect, the numbers N1 and N2 are chosen rather close to define a narrow selection window, for example, a window ranging between 33 and 38 pulses, and may even be chosen equal for maximum security.

In spite of these precautions, experience shows that a microprocessor provided with a device of the above described type may accidentally switch into the test mode, and in particular, when the microprocessor and the printed circuit board on which it is arranged are disposed in a very noisy electromagnetic environment that is likely to generate parasitic signals on the counting input E1.

Such a selection device for the operating mode of a microprocessor has, however, the advantage of being straightforward to implement because it only requires a counter and a decoder having both a low cost and small size.

SUMMARY OF THE INVENTION

An object of the present invention is to improve the switching security of a microprocessor into a specific operating mode, while using a counting device of the above described type.

This object is achieved by a microprocessor comprising selection means for selecting an operating mode thereof. The selection means comprises a counter having a counting input and a reset input, and means for coupling the counting input to a first terminal of the microprocessor. The selection means further comprises means for coupling the reset input of the counter to a second terminal of the microprocessor, and means, within or external the microprocessor, for maintaining by default the reset input of the counter at a first logic value ensuring the maintaining at zero of the counter in the absence of a control signal likely to be applied to the second terminal for activating the counter.

According to one embodiment, the means for coupling the reset input of the counter to the second terminal of the microprocessor comprises a logic circuit comprising an output coupled to the reset input, a first input coupled to the second terminal of the microprocessor, and a second input receiving a signal ensuring the inhibition of the output of the logic circuit with regard to its first input outside selection periods of the operating mode of the microprocessor.

The inhibit signal of the logic circuit may be a reset signal of the microprocessor. The logic circuit may comprise an AND gate having a first input connected to the second terminal, and a second input connected to the output of an inverting gate receiving as an input the reset signal of the microprocessor. The means for maintaining by default the reset input of the counter at a first logic value may comprise a bias resistor. The output of the counter may be applied to a central processing unit of the microprocessor by a decoder delivering to the central processing unit mode bits, the value of which depends on a counting result delivered by the counter.

The means for coupling the counting input of the counter to a first terminal of the microprocessor may comprise a logic circuit comprising an output coupled to the counting input, a first input coupled to the first terminal of the microprocessor, and a second input receiving a signal ensuring the inhibition of the output of the logic circuit with regard to its first input outside selection periods of the operating mode of the microprocessor.

The operating mode may be a test or a servicing mode requiring the application of a predetermined number of electric pulses to the counting input of the counter during a selection period of the operating mode of the microprocessor. The first and the second terminals are preferably used as input/output ports of the microprocessor for outside selection periods of the operating mode of the microprocessor.

The present invention also relates to a method of selecting an operating mode of a microprocessor by a counter having a counting input and a reset input. The method preferably comprises a step of applying a predetermined number of pulses to the counting input by a first terminal of the microprocessor, and providing means for coupling the reset input of the counter to a second terminal of the microprocessor. The reset input of the counter is driven by a control signal applied to the second terminal of the microprocessor for activating the counter. The method further includes providing means, internal or external the microprocessor, for maintaining by default the reset input of the counter at a first logic value ensuring the maintaining at zero of the counter in the absence of the control signal.

The method preferably comprises a step of providing a first logic circuit comprising an output coupled to the reset input of the counter, a first input coupled to the second terminal of the microprocessor, and a second input receiving a signal ensuring the inhibition of the output of the logic circuit with regard to its first input outside selection periods of the operating mode of the microprocessor.

The method also preferably comprises a step of providing a second logic circuit comprising an output coupled to the counting input of the counter, a first input coupled to the first terminal of the microprocessor, and a second input receiving a signal ensuring the inhibition of the output of the logic circuit with regard to its first input outside selection periods of the operating mode of the microprocessor.

The inhibit signal may be a reset signal of the microprocessor. The operating mode may be a test or a servicing mode selected by applying a predetermined number of electrical pulses to the counting input of the counter while a reset signal of the microprocessor has an active value.

BRIEF DESCRIPTION OF THE DRAWINGS

These objects, characteristics and advantages as well as others of the present invention will be exposed in more detail in the following description of an exemplary embodiment of a device according to the invention, given in a non-limiting way in conjunction with the accompanying drawings, in which:

FIGS. 3A, 3B and 3C show signals illustrating the operation of the selection device according to the present invention.

DETAILED DESCRIPTION OF THE PREFERRED EMBODIMENTS

Figure 1:
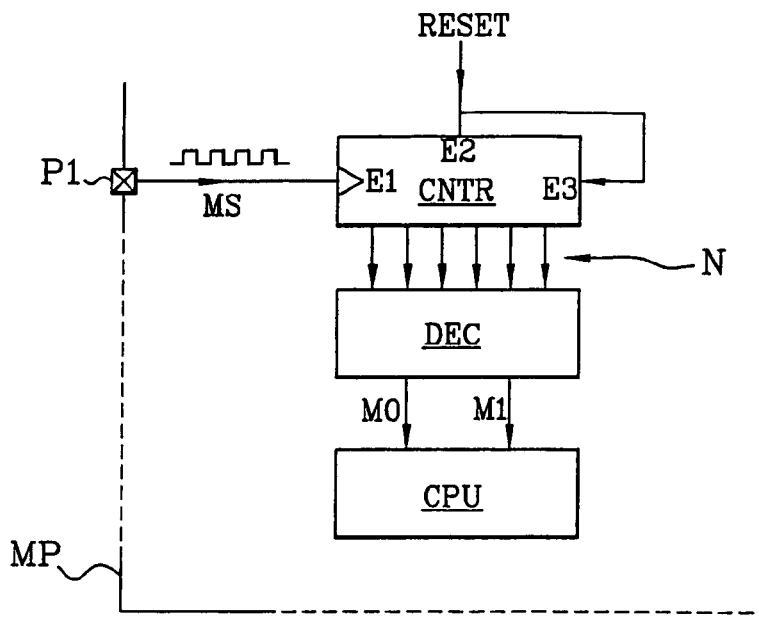
FIG. 1 shows schematically a microprocessor comprising a conventional selection device for selecting an operating mode thereof according to the prior art.
Figure 2:
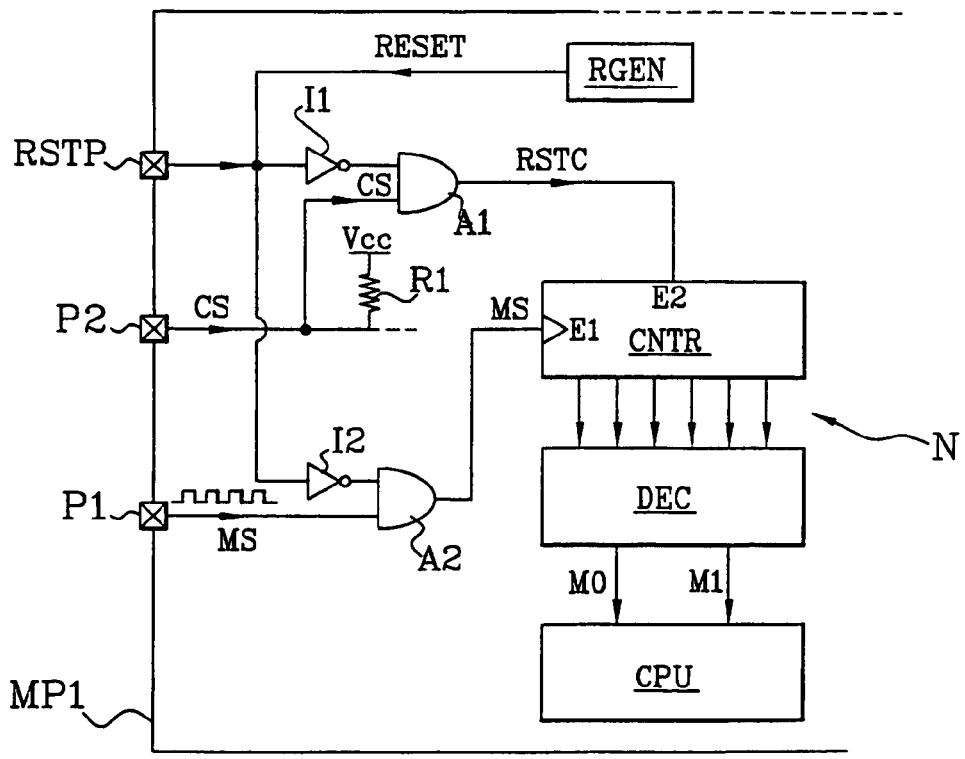
FIG. 2 shows schematically a microprocessor comprising a selection device for selecting an operating mode thereof according to the present invention.

FIG. 2 shows schematically a microprocessor MP1 with a device according to the invention for ensuring the selection of the operating mode thereof by pulse counting, according to the principle described above. The device thus comprises a counter CNTR, the output of which is applied to the central processing unit CPU of the microprocessor by a decoder DEC which delivers mode bits M0 and M1.

Counter CNTR has a counting input E1 and a reset input E2. Input E1 is coupled to a terminal P1 of the microprocessor for receiving a mode selection signal MS formed by a series of electrical pulses. The signal RESET is conventionally delivered by an internal generator RGEN providing the reset of the microprocessor at its power-on, but may also be forced to 0 by a terminal RSTP of the microprocessor, for example, when a reset is desired during the run of a program. As previously discussed, the initialization period of the microprocessor is the period during which the signal RESET is brought to its active value, here the value 0.

According to the invention, input E2 of the counter is driven by the output of a logic circuit having a first input connected to a terminal P2 of the microprocessor and a second input receiving the signal RESET. This logic circuit comprises a gate A1 of the AND-type having a first input connected to terminal P2, and a second input connected to the output of an inverting gate I1 receiving the signal RESET as an input. Thus, during the initialization period of the microprocessor when the signal RESET is at 0, input E2 of the counter may be driven by a control signal CS applied to terminal P2, as gate A1 receives a 1 on its input connected to the output of gate I1 and is thus relatively transparent to signal CS.

Still according to the invention, control signal CS present on terminal P2 is maintained by default at a logic value which ensures the inhibition of the counter CNTR when the signal RESET is at 0. The value by default of signal CS, here the value 1, is imposed by a pull-up resistor R1 at the high state, a terminal of which receives the supply voltage Vcc of the microprocessor, and the other input of which is connected to terminal P2. Resistor R1 is preferably an internal resistor of the microprocessor, but may also be provided on an external line connected to terminal P2.

In an alternative embodiment leading to a similar result, resistor R1 may be directly connected to the output of gate A1 and to the input E2 of the counter. However, the fact of letting signal CS in a floating state may involve undesirable commutations of gate A1. Another alternative includes providing resistor R1 on an external conductive line connected to terminal P2.

Optionally but advantageously, the first terminal P1 of the microprocessor, which receives the selection signal MS, is coupled to the counting input E1 by a logic circuit ensuring the isolation of input E1 with regard to terminal P1 outside initialization periods. This logic circuit comprises, for example, a gate A2 of the AND-type having a first input connected to terminal P1, and a second input connected to the output of an inverting gate I2 receiving the signal RESET as an input. Gate A2 prohibits the application of the signal MS to input E1 when the signal RESET is at 1.

Table 1 describes in relation with FIGS. 3A, 3B and 3C the operations to be performed to ensure the start of the microprocessor in a specific operating mode, for example, a test mode, during the initialization period of the microprocessor. FIG. 3A shows the signal RESET, FIG. 3B shows the control signal CS, and FIG. 3C shows the pulses forming signal MS.

During a first phase PH1 of the initialization period, the signal RESET is at 0 and gate A1 receives a 1 on its input connected to the inverting gate I1. Gate A1 is thus transparent with regard to signal CS, which is maintained at 1 by resistor R1. Thus, signal RSTC is at 1 at the output of gate A1, and the counter is inactive and maintained at zero.

During a second phase PH2 of the initialization period, signal CS is forced to 0 (FIG. 3B) by a voluntary intervention on terminal P2, performed for example, by an appropriate tool (conductive tip) if the microprocessor is arranged on a printed circuit board provided for a predetermined application. When the signal CS is forced to 0, the signal RSTC passes to 0 at the output of gate A1 and counter CNTR is activated. A series of pulses between N1 and N2 pulses may then be applied to terminal P1 (signal MS, FIG. 3C).

TABLE 1

| RESET | CS | RSTC | Phase |
|---|---|---|---|
| 0 | 1 | 1 | PH1: counter inactive and maintained at zero |
| 0 | 0 | 0 | PH2: counter active (counting period) |
| 1 | X (1 or 0) | 0 | PH3: the output of the counter is locked, as counting input E1 is isolated from terminal P1 by logic circuit A2/I2-Input E2 of the counter is inhibited by signal RESET (output of circuit A1 at 1) |

During a third phase PH3, the signal RESET passes to 1 and the initialization period is finished. The passage to 1 of the signal RESET inhibits the counting, as gate A2 is no longer transparent, and its output is forced to 0. The number N present at the output of the counter, corresponding to the number of pulses received on input E1, is transformed by the decoder DEC into a mode bit M0 or M1. The passage to 1 of the signal RESET forces also to 0 the signal RSTC at the output of gate A1, so that control signal CS has no more influence on the counter and may be released a few clock cycles after the end of the initialization period.

In a conventional way, the decoder DEC sets to 1 the mode bit M1 if the number N is between N1 and N2, for example, between 33 and 38 pulses, so that the central processing unit CPU runs a test program located at a specific address of the microprocessor's memory. In the opposite case, the mode bit M0 is set to 1 (user mode) and the mode bit M1 remains at 0.

As this will be clearly apparent to those skilled in the art, the microprocessor MP1 provides an excellent immunity against an involuntary switching into the test mode M1 in the presence of electromagnetic signals. As a matter of fact, the switching into the test mode is subject to two conditions. A first condition is a conventional condition linked to the number of pulses applied to terminal P1, and a second condition is an additional condition due to the necessity of forcing to zero the control signal CS on terminal P2 so that the counter is activated.

Thus, if electromagnetic parasites generate N electrical pulses on terminal P1 during the initialization period of the microprocessor, and if N is between N1 and N2, the switching into the test mode will only occur if terminal P2 is in addition forced to 0 during the appearance of the N parasitic pulses. However, the probability that such a combination of signals occurs in an involuntary manner may be considered as almost being equal to zero, since it is not very probable that a disturbing phenomenon maintains the signal CS at 0 in a stable way while generating the N pulses on input E1. In fact, it is enough that the effect of the disturbing phenomenon stops a short time in order that the signal CS switches again to 1 by the bias resistor R1 so that the counter is reset to zero.

The present invention is of course likely to have various alternatives as readily appreciated by those skilled in the art. In particular, although the counter described above does not comprise means for locking its output because of the inhibition of its counting input with regard to terminal P1 by the logic circuit A2/I2, such locking means will have to be provided if the logic circuit A2/I2 is suppressed and input E1 is directly connected to terminal P1.

Also, input E2 of the counter may be directly driven by control signal CS without interposition of logic circuit A1/I1. However, the fact that the logic circuits A2/I2 and A1/I1 isolate the inputs E1 and E2 of the counter with regard to terminals P1, P2 when the signal RESET is at 1, allows the use of terminals P1, P2 for receiving other signals during the normal operation periods of the microprocessor, i.e., outside the initialization periods.

Thus, in a preferred embodiment of the invention, terminals P1 and P2 are also used as input/output ports and are, to this effect, coupled to input/output buffers of the microprocessor (not shown). This allows the number of external terminals of the microprocessor to be reduced, avoiding the need of providing two terminals dedicated to the selection of the operating mode.

On the other hand, it will be clearly apparent that the logic values of the signals described in the foregoing have a relative value only. Thus, the logic circuit comprising gates A1 and I1, which is transparent with regard to the control signal CS during the initialization period PH1–PH2, could be implemented by an OR-gate by choosing opposite conventions for the active value of the signals.

Also, although there has been described in the foregoing a microprocessor which comprises a default operating mode M0 (bit M0 at 1) and a specific operating mode M1 protected against parasitic phenomena, it is clear that the present invention is suitable for the selection of a plurality of specific operating modes M1, M2, M3, . . . Each operating mode may be identified by a predetermined number of pulses applied to the input E1 of the counter. This number of pulses may be fixed or may be between two predetermined values.

That which is claimed is:
1. A microprocessor comprising:
a first terminal for receiving a mode selection signal;
a second terminal for receiving a control signal; and
selection means connected to the first and second terminals for selecting an operating mode of the microprocessor based upon the mode selection signal and the control signal, said selection means comprising
a counter having a counting input and a reset input,
first coupling means coupling the counting input to the first terminal,
second coupling means coupling the reset input to the second terminal, and
default means for maintaining by default the reset input at a first logic value for ensuring that said counter is maintained at zero in an absence of the control signal.

2. A microprocessor according to claim 1, wherein said default means is internal to the microprocessor.

3. A microprocessor according to claim 1, wherein said default means is external to the microprocessor.

4. A microprocessor according to claim 1, wherein said default means comprises a bias resistor.

5. A microprocessor according to claim 1, wherein said second coupling means comprises a second logic circuit having an output coupled to the reset input of said counter, a first input coupled to the second terminal, and a second input for receiving an inhibit signal for inhibiting the output of said second logic circuit when the first input receives the control signal outside a selection period for selecting an operating mode of the microprocessor.

6. A microprocessor according to claim 5, wherein the inhibit signal is a reset signal of the microprocessor.

7. A microprocessor according to claim 6, wherein said second logic circuit comprises:
  an invertor having an input for receiving the reset signal; and
  an AND-gate having a first input connected to the second terminal, and a second input connected to an output of said invertor.

8. A microprocessor according to claim 1, further comprising;
  a decoder connected to an output of said counter for delivering at least one mode bit, with a value of each mode bit being based upon a counting result delivered by said counter; and
  a central processing unit connected to an output of said decoder for receiving, the at least one mode bit.

9. A microprocessor according to claim 1, wherein said first coupling means comprises a first logic circuit having an output coupled to the counting input of said counter, a first input coupled to the first terminal, and a second input for receiving an inhibit signal for inhibiting the output of said first logic circuit when the first input receives the mode selection signal outside a selection period for selecting an operating mode of the microprocessor.

10. A microprocessor according to claim 1, wherein the operating mode is a test mode or a servicing mode requiring application of a predetermined number of pulses to the counting input of said counter during a selection period for selecting the operating mode of the microprocessor.

11. A microprocessor according to claim 1, wherein the first and the second terminals are used as input/output ports of the microprocessor when the microprocessor is operating outside a selection period for selecting the operating mode thereof.

12. A microprocessor comprising:
  a first terminal for receiving a mode selection signal;
  a second terminal for receiving a control signal; and
  a selection circuit connected to the first and second terminals for selecting a mode of the microprocessor based upon the mode selection signal and the control signal, said selection circuit comprising
    a counter having a counting input and a reset input,
    a first coupling circuit coupling the counting input to the first terminal,
    a second coupling circuit coupling the reset input to the second terminal, and
    a device for maintaining the reset input at a first logic value for ensuring that said counter is maintained at a predetermine value in an absence of the control signal.

13. A microprocessor according to claim 12, wherein said device comprises a bias resistor connected internal to the microprocessor.

14. A microprocessor according to claim 12, wherein said device comprises a bias resistor connected external to the microprocessor.

15. A microprocessor according to claim 12, wherein said second coupling circuit has an output coupled to the reset input of said counter, a first input coupled to the second terminal, and a second input for receiving an inhibit signal for inhibiting the output of a second logic circuit when the first input receives the control signal outside a selection period for selecting a mode of the microprocessor.

16. A microprocessor according to claim 15, wherein the inhibit signal is a reset signal of the microprocessor.

17. A microprocessor according to claim 16, wherein said second coupling circuit comprises:
  an invertor having an input for receiving the reset signal; and
  an AND-gate having a first input connected to the second terminal, and a second input connected to an output of said invertor.

18. A microprocessor according to claim 12, further comprising:
  a decoder connected to an output of said counter for delivering at least one mode bit, with a value of each mode bit being based upon a counting result delivered by said counter; and
  a central processing unit connected to an output of said decoder for receiving the at least one mode bit.

19. A microprocessor according to claim 12, wherein said first coupling circuit comprises a first logic circuit having an output coupled to the counting input of said counter, a first input coupled to the first terminal, and a second input for receiving an inhibit signal for inhibiting the output of said first coupling circuit when the first input receives the mode selection signal outside a selection period for selecting a mode of the microprocessor.

20. A microprocessor according to claim 12, wherein the mode is a test mode or a servicing mode requiring application of a predetermined number of pulses to the counting input of said counter during a selection period for selecting the mode of the microprocessor.

21. A microprocessor according to claim 12, wherein the first and the second terminals are used as input/output ports of the microprocessor when the microprocessor is operating outside a selection period for selecting the mode thereof.

22. A method for selecting an operating mode of a microprocessor comprising a counter having a counting input and a reset input, and a first coupling circuit coupling the counting input to a first terminal of the microprocessor, and a second coupling circuit coupling the reset input to a second terminal of the microprocessor, the method comprising:
  driving the counting input with a mode selection signal applied to the first terminal of the microprocessor;
  driving the reset input by a control signal applied to the second terminal for activating the counter; and
  maintaining by default the reset input at a first logic value for ensuring that the counter is maintained at a predetermined value in an absence of the control signal.

23. A method according to claim 22, wherein the maintaining by default is accomplished using a bias resistor internal to the microprocessor.

24. A method according to claim 22, wherein the maintaining by default is accomplished using a bias resistor external to the microprocessor.

25. A method according to claim 22, wherein the second coupling circuit has an output coupled to the reset input of the counter, a first input coupled to the second terminal, and a second input; the method further comprising applying an inhibit signal to the second input for inhibiting the output of a second logic circuit when the first input receives the control signal, outside a selection period for selecting an operating mode of the microprocessor.

26. A method according to claim 25, wherein the inhibit signal is a reset signal of the microprocessor.

27. A method according to claim 22, wherein the mode selection signal includes a predetermined number of pulses; the further comprising:
   using the counter for counting the number of pulses in the mode selection signal;
   generating at least one mode bit based upon the number of pulses counted; and
   delivering the at least one mode bit to a central processing unit.

28. A method according to claim 22, wherein the first coupling circuit has an output coupled to the counting input of the counter, a first input coupled to the first terminal, and a second input; the method further comprising applying an inhibit signal to the second input for inhibiting the output of the first coupling circuit when the first input receives the mode selection signal outside a selection period for selecting an operating mode of the microprocessor.

29. A method according to claim 22, wherein the operating mode is a test mode or a servicing mode requiring application of a predetermined number of pulses to the counting input of the counter during a selection period for selecting the operating mode of the microprocessor.

30. A method according to claim 22, wherein the first and the second terminals are used as input/output ports of the microprocessor when the microprocessor is operating outside a selection period for selecting the operating mode thereof.

31. A microprocessor comprising:
   a first terminal for receiving a mode selection signal;
   a second terminal for receiving a control signal; and
   a selection circuit connected to the first and second terminals for selecting a mode of the microprocessor based upon the mode selection signal and the control signal, said selection circuit comprising
      a counter having a counting input and a reset input,
      a first coupling circuit coupling the counting input to the first terminal, and comprising
         a first logic circuit having an output coupled to the counting input of said counter,
         a first input coupled to the first terminal, and
         a second input for receiving an inhibit signal for inhibiting the output of said first coupling circuit when the first input receives the mode selection signal outside a selection period for selecting a mode of the microprocessor, and
      a second coupling circuit coupling the reset input to the second terminal, and
      a device for maintaining, the reset input at a first logic value for ensuring that said counter is maintained at a predetermined value in an absence of the control signal.

32. A microprocessor according to claim 31, wherein said device comprises a bias resistor connected internal to the microprocessor.

33. A microprocessor according to claim 31, wherein said device comprises a bias resistor connected external to the microprocessor.

34. A microprocessor according to claim 31, wherein said second coupling circuit has an output coupled to the reset input of said counter, a first input coupled to the second terminal, and a second input for receiving an inhibit signal for inhibiting the output of the said second logic circuit when the first input receives the control signal outside a selection period for selecting a mode of the microprocessor.

35. A microprocessor according to claim 34, wherein the inhibit signal is a reset signal of the microprocessor.

36. A microprocessor according to claim 35, wherein said second coupling circuit comprises:
   an invertor having an input for receiving the reset signal; and
   an AND-gate having a first input connected to the second terminal, and a second input connected to an output of said invertor.

37. A microprocessor according to claim 31, further comprising:
   a decoder connected to an output of said counter for delivering at least one mode bit, with a value of each mode bit being based upon a counting result delivered by said counter; and
   a central processing unit connected to an output of said decoder for receiving the at least one mode bit.

38. A microprocessor according to claim 31, wherein the mode is a test mode or a servicing mode requiring application of a predetermined number of pulses to the counting input of said counter during a selection period for selecting the mode of the microprocessor.

39. A microprocessor according to claim 31, wherein the first and the second terminals are used as input/output ports of the microprocessor when the microprocessor is operating outside a selection period for selecting the mode thereof.

40. A microprocessor comprising:
   a line receiving a reset signal having an active state during a resetting period of the microprocessor;
   a first terminal for receiving a mode selection signal;
   a second terminal for receiving a control signal that is different from the reset signal; and
   a selection circuit connected to the first and second terminals for selecting a mode of the microprocessor based upon the mode selection signal and the control signal, said selection circuit comprising
      a counter having a counting input and a reset input,
      a first coupling circuit coupling the counting input to the first terminal,
      a second coupling circuit coupling the reset input to the second terminal, and comprising
         an output coupled to the reset input of said counter,
         a first input coupled to the second terminal,
         a second input for receiving an inhibit signal for inhibiting the output of said second coupling circuit when the first input receives the control signal outside a selection period for selecting a mode of the microprocessor, the selection period corresponding to a period when the reset signal is in the active state, and
      a device for maintaining the reset input at a first logic value for ensuring that said counter is maintained at a predetermined value in an absence of the control signal.

41. A microprocessor according to claim 40, wherein said device comprises a bias resistor connected internal to the microprocessor.

42. A microprocessor according to claim 40, wherein said device comprises a bias resistor connected external to the microprocessor.

43. A microprocessor according to claim 40, wherein the inhibit signal is a reset signal of the microprocessor.

44. A microprocessor according to claim 43, wherein said second coupling circuit comprises:
- an invertor having an input for receiving the reset signal; and
- an AND-gate having a first input connected to the second terminal, and a second input connected to an output of said invertor.

45. A microprocessor according to claim 40, further comprising:
- a decoder connected to an output of said counter for delivering at least one mode bit, with a value of each mode bit being based upon a counting result delivered by said counter; and
- a central processing unit connected to an output of said decoder for receiving the at least one mode bit.

46. A microprocessor according to claim 40, wherein said first coupling circuit comprises a first logic circuit having an output coupled to the counting input of said counter, a first input coupled to the first terminal, and a second input for receiving an inhibit signal for inhibiting the output of said first coupling circuit when the first input receives the mode selection signal outside a selection period for selecting a mode of the microprocessor.

47. A microprocessor according to claim 40, wherein the mode is a test mode or a servicing mode requiring application of a predetermined number of pulses to the counting input of said counter during a selection period for selecting the mode of the microprocessor.

48. A microprocessor according to claim 40, wherein the first end the second terminals are used as input/output ports of the microprocessor when the microprocessor is operating outside a selection period for selecting the mode thereof.

49. A microprocessor according to claim 40, wherein said counter is maintained at a predetermined value in an absence of the control signal at least when said second logic circuit is not inhibited.

\* \* \* \* \*